United States Patent
Arsovski

(10) Patent No.: US 8,117,567 B2
(45) Date of Patent: Feb. 14, 2012

(54) STRUCTURE FOR IMPLEMENTING MEMORY ARRAY DEVICE WITH BUILT IN COMPUTATION CAPABILITY

(75) Inventor: Igor Arsovski, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 815 days.

(21) Appl. No.: 12/110,456

(22) Filed: Apr. 28, 2008

(65) Prior Publication Data

US 2009/0141566 A1 Jun. 4, 2009

Related U.S. Application Data

(63) Continuation-in-part of application No. 11/949,068, filed on Dec. 3, 2007, now Pat. No. 7,646,648.

(51) Int. Cl.
*G06F 17/50* (2006.01)
*G11C 7/10* (2006.01)

(52) U.S. Cl. ............ 716/100; 365/189.04; 365/154; 365/189.07; 365/203; 365/204; 716/111; 716/119

(58) Field of Classification Search ............ 716/100, 716/111, 119; 365/189.04, 154, 189.07, 365/203, 204
See application file for complete search history.

(56) References Cited

U.S. PATENT DOCUMENTS

| | | | |
|---|---|---|---|
| 3,402,398 A | 9/1968 | Koerner et al. | |
| 3,483,528 A | 12/1969 | Koerner | |
| 5,388,066 A | 2/1995 | Hamamoto et al. | |
| 5,828,612 A * | 10/1998 | Yu et al. | 365/203 |
| 5,831,896 A | 11/1998 | Lattimore et al. | |
| 5,859,791 A | 1/1999 | Schultz et al. | |
| 5,893,137 A | 4/1999 | Parks et al. | |
| 5,995,401 A | 11/1999 | Schultz et al. | |
| 6,046,923 A | 4/2000 | Evans et al. | |
| 6,392,910 B1 | 5/2002 | Podaima et al. | |
| 6,487,101 B1 | 11/2002 | Ashbrook et al. | |
| 6,609,236 B2 * | 8/2003 | Watanabe et al. | 716/119 |
| 6,618,279 B2 | 9/2003 | Towler et al. | |
| 6,618,281 B1 | 9/2003 | Gordon | |
| 6,781,857 B1 | 8/2004 | Lien et al. | |
| 6,836,877 B1 | 12/2004 | Dupenloup | |
| 7,054,994 B2 | 5/2006 | Kastoriano et al. | |
| 7,057,913 B2 | 6/2006 | Hsu et al. | |
| 7,120,732 B2 | 10/2006 | Braceras et al. | |
| 7,206,251 B1 | 4/2007 | Yu | |
| 7,355,881 B1 * | 4/2008 | Dankert et al. | 365/156 |

(Continued)

OTHER PUBLICATIONS

F. Shafai et al., "Fully Parallel 30-MHz, 2.5-Mb CAM;" IEEE Journal of Solid-State Circuits, vol. 33, No. 11 Nov. 1998, pp. 1690-1696.

(Continued)

*Primary Examiner* — Jack Chiang
*Assistant Examiner* — Patrick Sandoval
(74) *Attorney, Agent, or Firm* — Cantor Colburn LLP; Michael LeStrange

(57) ABSTRACT

A design structure embodied in a machine readable medium used in a design process includes computational memory device having an array of memory cells arranged in rows and columns, and a pair of read word lines associated with each row of the array. The array is configured to implement, for a given cycle, either a read operation of data contained in a single selected row, or one of a plurality of different bit wise logical operations on data contained in multiple selected rows.

17 Claims, 17 Drawing Sheets

U.S. PATENT DOCUMENTS

| | | | |
|---|---|---|---|
| 7,447,812 B1 | 11/2008 | Mo et al. | |
| 7,688,611 B2 | 3/2010 | Arsovski et al. | |
| 7,848,128 B2 | 12/2010 | Arsovski et al. | |
| 7,859,878 B2 | 12/2010 | Arsovski et al. | |
| 7,895,560 B2 * | 2/2011 | Lovell | 716/119 |
| 7,924,588 B2 | 4/2011 | Arsovski et al. | |
| 2001/0014051 A1 * | 8/2001 | Watanabe et al. | 365/230.03 |
| 2002/0191605 A1 | 12/2002 | Lunteren et al. | |
| 2004/0083336 A1 | 4/2004 | Stark et al. | |
| 2005/0108666 A1 * | 5/2005 | Chang et al. | 716/2 |
| 2005/0185436 A1 | 8/2005 | Braceras et al. | |
| 2006/0047719 A1 | 3/2006 | Hershkovich et al. | |
| 2006/0190679 A1 | 8/2006 | Albrecht et al. | |
| 2006/0203529 A1 | 9/2006 | Radke | |
| 2007/0180419 A1 * | 8/2007 | Sherlekar et al. | 716/9 |
| 2008/0082786 A1 * | 4/2008 | Lovell | 712/15 |
| 2008/0229270 A1 * | 9/2008 | Boerstler et al. | 716/12 |
| 2008/0298110 A1 | 12/2008 | Wickeraad et al. | |
| 2009/0108899 A1 * | 4/2009 | Bhatia et al. | 327/261 |
| 2009/0141527 A1 | 6/2009 | Arsovski et al. | |
| 2009/0141528 A1 | 6/2009 | Arsovski et al. | |
| 2009/0141529 A1 | 6/2009 | Arsovski et al. | |
| 2009/0190386 A1 | 7/2009 | Kim | |
| 2011/0096582 A1 | 4/2011 | Arsovski et al. | |

OTHER PUBLICATIONS

U.S. Appl. No. 11/532,233, filed Sep. 12, 2006 for CAM Asynchronouse Search-Line Switching.

U.S. Appl. No. 12/110,582; Non-Final Office Action; Date Filed: Apr. 28, 2008; Date Mailed: Mar. 24, 2011.

U.S. Appl. No. 12/110,582; Final Office Action; Date Filed: Apr. 28, 2008; Date Mailed: Sep. 7, 2011.

* cited by examiner

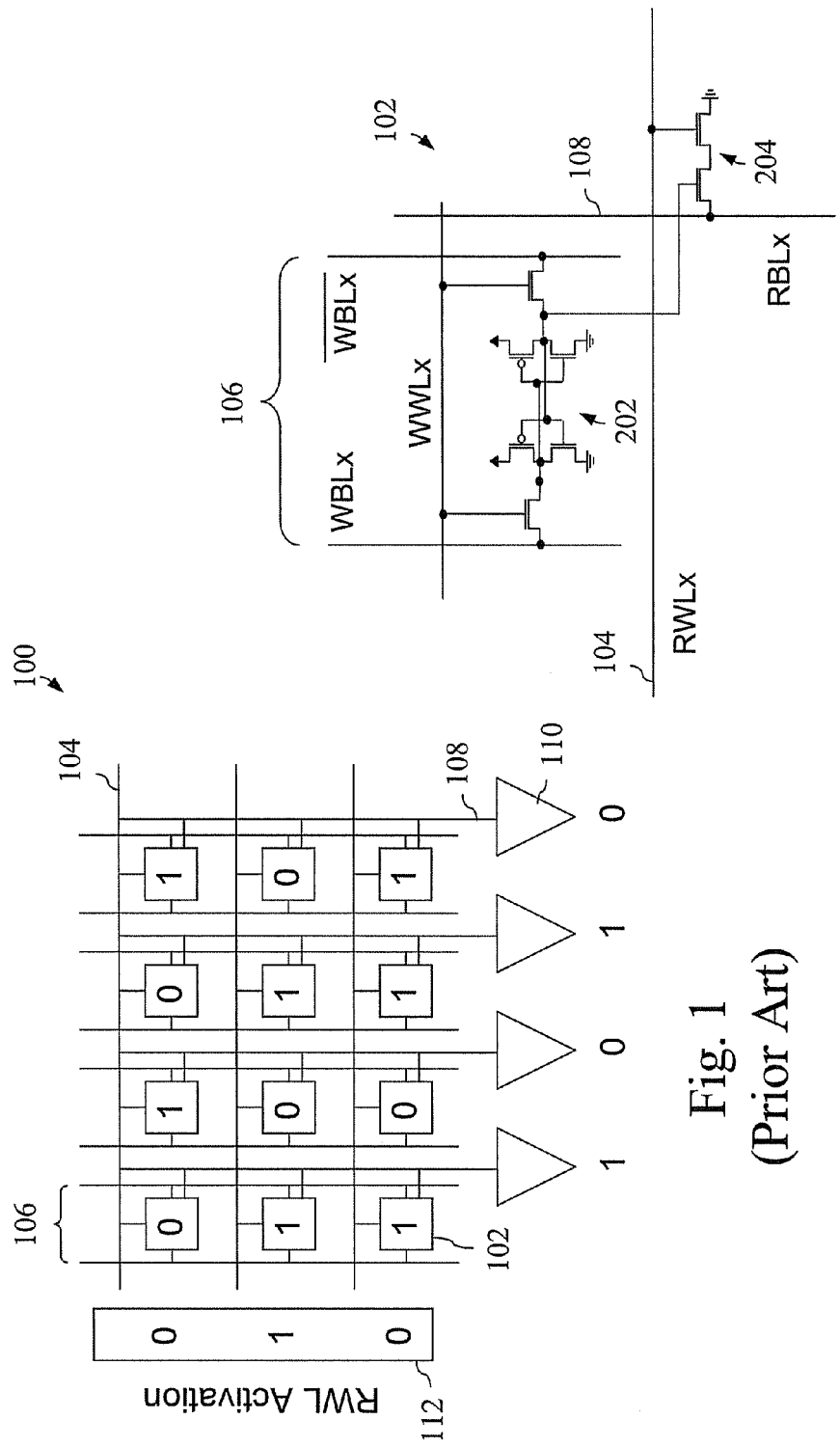

US 8,117,567 B2

STRUCTURE FOR IMPLEMENTING MEMORY ARRAY DEVICE WITH BUILT IN COMPUTATION CAPABILITY

CROSS-REFERENCE TO RELATED APPLICATIONS

This non-provisional U.S. patent application is a continuation in part of pending U.S. patent application Ser. No. 11/949,068, which was filed Dec. 3, 2007, and is assigned to the present assignee.

BACKGROUND

The present invention relates generally to integrated circuit memory devices and, more particularly, to a design structure for implementing a memory array device with built in computational capability.

Existing computer designs typically provide a direct connection between the processor and its associated memory components. In conventional designs, data values are exchanged between the processor and the memory components, which containing load/store addresses and load/store data objects going in and out of the processor.

In order to improve the computational power of microprocessors, the processing element or arithmetic logic unit (ALU) may be positioned as close as possible to the source of the data (e.g., the memory array) so as to promote a high data bandwidth between the two structures. Thus, modem microprocessors commonly feature large capacity memories next to the ALU in the form of, for example, L1, L2 and other caches. Although this added memory improves performance, it also increases the die area and thus the cost of each microprocessor chip.

Other attempts at increasing the computational speed of a processing device involve placing one-bit SIMD (Single-Instruction Stream Multiple-Data Stream) processor within the memory circuitry, adjacent to the sense amplifiers in both SRAM (Static Random Access Memory) and DRAM (Dynamic Random Access Memory) arrays. However, for small memories, the overhead of this bit-wise ALU approach is high. In addition, the operands need to be read out one at a time, and only then can the result be computed in the ALU attached to the sense-amp.

Accordingly, it would be desirable to be able to implement structures that provide a memory array device with built in computational capability in a manner that does not require the use of a physical ALU circuit incorporated into the memory structure, and such that multiple operands may be selected together with the result ready in the same cycle as the operand fetch (read).

SUMMARY

The foregoing discussed drawbacks and deficiencies of the prior art are overcome or alleviated by a design structure embodied in a machine readable medium used in a design process, the design structure including a computational memory device including an array of memory cells arranged in rows and columns, and a pair of read word lines associated with each row of the array. The array is configured to implement, for a given cycle, either a read operation of data contained in a single selected row, or one of a plurality of different bit wise logical operations on data contained in multiple selected rows.

BRIEF DESCRIPTION OF THE DRAWINGS

Referring to the exemplary drawings wherein like elements are numbered alike in the several Figures:

FIG. 1 is a schematic diagram illustrating the operation of a conventional SRAM array;

FIG. 2 is a schematic diagram illustrating the structure of an 8-transistor (8T) cell of the SRAM array of FIG. 1;

DETAILED DESCRIPTION

Figure 3:
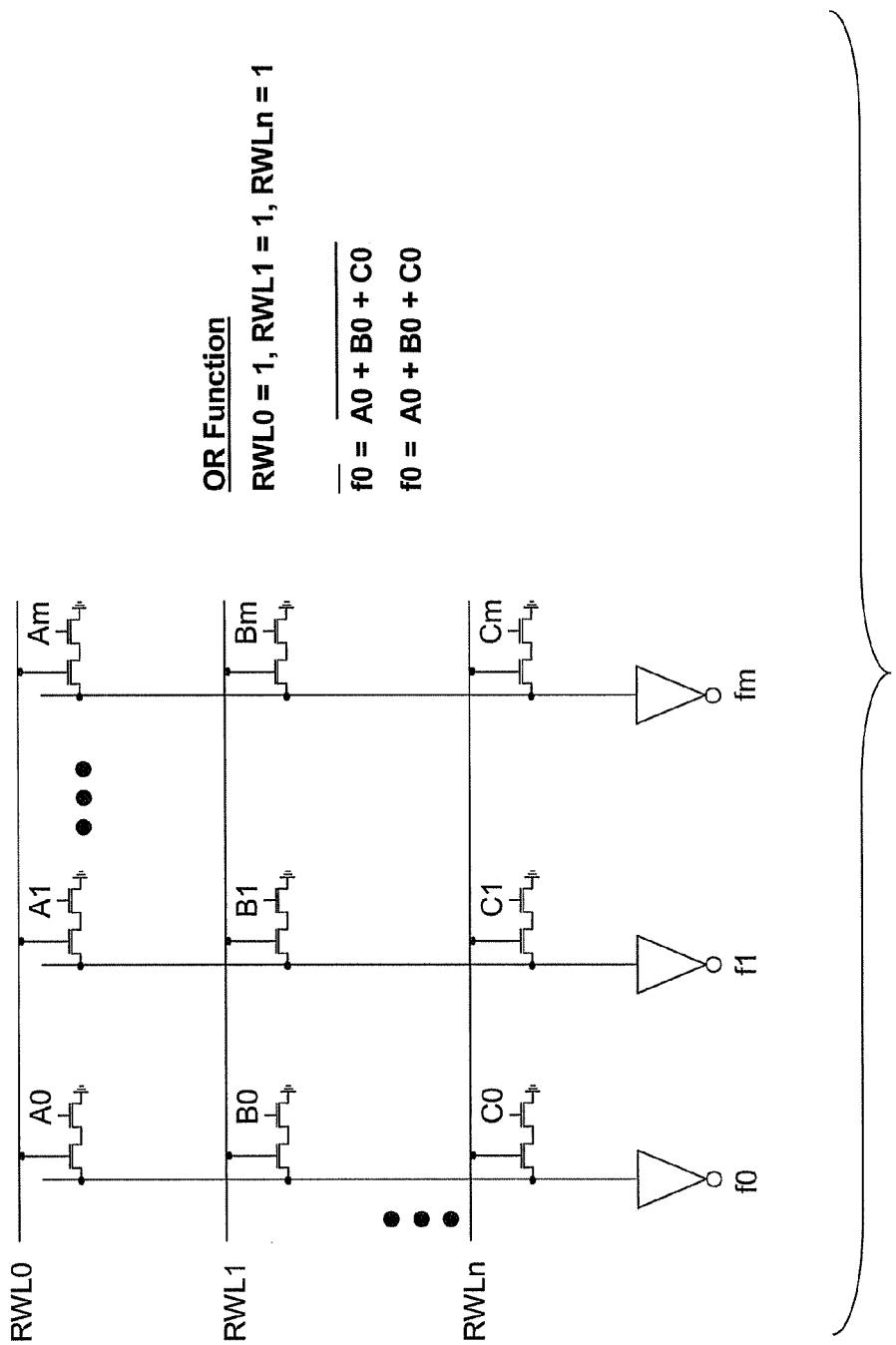
FIG. 3 is a schematic diagram illustrating the use of the array of FIG. 1 to implement a bit wise, logical OR operation of bits in a given column by simultaneous activation of multiple read word lines.

Disclosed herein is a novel design structure embodied in a machine readable medium used in a design process for implementing a memory array device with built in computational capability, wherein a physical ALU circuit is not necessarily needed to achieve the capability. Rather, the computation is executed as a part of the memory array itself. It will be noted, however, that even further improvements can be also achieved by embedding an ALU within the memory and allowing the ALU to benefit from the high internal memory bandwidth. In other words, the present approach described below can also be combined with existing methods and structures to achieve even more complex operations than simple bitwise logic operations.

Briefly stated, a novel memory cell structure and supporting architecture effectively allows for the implementation of a "distributed ALU" across the memory array. This new cell and architecture allows an even more powerful processing element which executes the logic operation concurrently with the read operation. Furthermore, this new cell and architecture allows the ability to perform bitwise operation on more than one operand of the memory. By modifying the memory cell as described hereinafter, as well as the read support circuitry, the memory can perform logic bit-wise operations such as "OR" and "AND" on multiple words concurrently. Through execution of these operations, the processing element can technically implement any logic function on any combination of stored words in the memory array. Additional modifications of the whole system such as the implementation of a ternary cell allow for the implementation of even more complex functions.

Referring initially to FIG. 1, there is shown a schematic diagram illustrating the operation of a conventional SRAM array 100. In the example depicted, the SRAM array 100 includes a plurality of individual cells 102, arranged into rows (in a word line direction) and columns (in a bit line direction). As further shown in FIG. 1, the array 100 also includes a plurality of read word lines 104 corresponding to the word bits in each row of the array, a pair of write bit lines 106 disposed in each row for presenting complement data pairs to the cell 102 to be written, and read bit lines 108 for sensing the state of the data within a selected cell during a read operation. The read bit lines 108 are each coupled to an associated sense amplifier to sense and latch the state of the date read from the cells. A given word or row is selected by an appropriate address signal applied to decode circuitry 112, which activated one of the read word lines 104. For purposes of simplicity, FIG. 1 does not illustrate write word lines used to access the SRAM cells when writing data thereto from write bit lines 106.

Although a simple 3×4 array is depicted for illustrative purposes, it will be appreciated that an actual SRAM array may have hundreds or thousands of bits in the row and column directions. In the specific example shown, the decode circuitry requests a read of the data in the second row of the array, which corresponds to '1010'. Thus, the output of the sense amplifiers reflects a reading of the second row data (1010).

FIG. 2 is a schematic diagram illustrating the structure of an 8-transistor (8T) cell 102 of the SRAM array of FIG. 1. In particular, the cell 102 includes a 6T SRAM storage device 202 and an NFET stack 204 connected in series between the associated read bit line (RBLx) 108 and ground. The SRAM storage device 202 has a pair of access transistors activated by the write word line (WWLx), which couples cell data from the write bit line pair 106 (WBLx, WBLx bar) to the 4T storage latch comprising a pair of cross-coupled CMOS inverters, as known in the art. In the embodiment illustrated, the gate terminal of the bottom (right) NFET in NFET stack 204 is coupled to the read word line 104 (RWLx), while the gate terminal of the top (left) NFET in NFET stack 204 is coupled to one of the cell data nodes (true or complement) of the SRAM storage device 202. Alternatively, the top NFET of the stack 204 could be coupled to the read word line 104 and the bottom NFET of the stack could be coupled to the SRAM storage device 202.

During a read operation of the cell 102, the voltage on RWLx goes high, thus activating the bottom NFET of NFET stack 204. Depending on the value of the data in the storage device 202, the top NFET of NFET stack 204 will either be conductive of non conductive. If conductive, the voltage on the precharged read bit line RBLx is discharged to ground; if non conductive, the voltage remains high. In either case, the data in the cell becomes known.

As is also known in the art, for a conventional read operation of the array 100 shown in FIG. 1, only one of the row word lines of the array may be activated during a given cycle, since each read bit line 108 is coupled to multiple cells within its corresponding column. However, as illustrated in FIG. 3, it will be seen that in the event more than one word line were to be activated, the result would be a logical OR operation of the bits in each column. For example, in the case where each of word lines RWL0, RWL1 and RWLn are activated, for any given column, the associated read bit line will be discharged if any of the associated column bits are a logical "1". In this example, the bit values (e.g., A0, B0, C0) coupled to the gates of the bottom NFETs in the NFET stacks correspond to the true nodes of the SRAM storage cells. By inverting the outputs on each read bit line, the following expressions hold:

$$\overline{f0} = \overline{A0} + \overline{B0} + \overline{C0};$$

$$f0 = A0 + B0 + C0.$$

Similarly, f1=A1+B1+C1 and fm=Am+Bm+Cm. Thus, it will be seen that, by simultaneously activating multiple read word lines, a conventional array which uses an 8T SRAM cell to perform a read can also be made to perform a bit wise, logical OR operation for the bits corresponding to the activated word lines. On the other hand, as is also known in the art of Boolean logic, complete logic (and therefore computing) functionality is not achieved solely through a logical "OR" capability; there must also be the capability of generating an "AND" or "NAND" operation for the operand values as well. However, such a capability does not exist for the conventional array structure of FIGS. 1 and 2.

Figure 4:
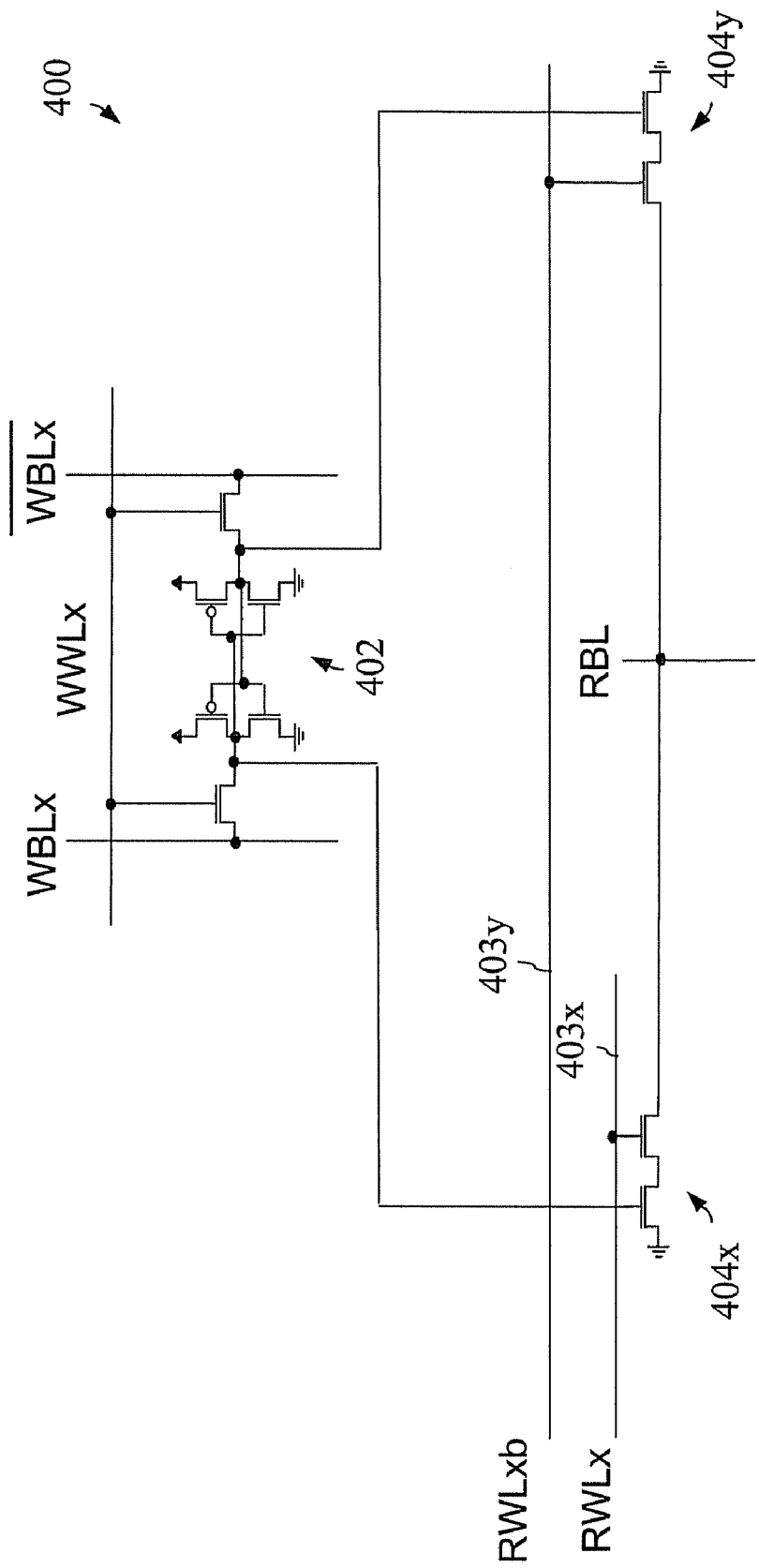
FIG. 4 is a schematic diagram of a 10-transistor (10T) memory cell that may be used to provide computational capability, in accordance with an embodiment of the invention.

Accordingly, FIG. 4 is schematic diagram of a 10-transistor (10T) memory cell 400 that may be used to provide (in addition to memory read/write functionality) computational capability, in accordance with an embodiment of the invention. In contrast to the 8T cell of FIG. 2, the 10T cell 400 of FIG. 4 includes a pair of read word lines 403x, 403y, for each row (also labeled as RWLx, RWLxb). Both of the read word lines 403x, 403y are each coupled to an associated NFET stack 404x, 404y, disposed between the read bit line RBL and ground. Whereas the bottom NFET of NFET stack 404x is controlled by the state of one of the cell nodes (e.g., the true node), the bottom NFET of NFET stack 404y is controlled by the state of the opposite cell node (e.g., the complement node). As will be seen below, this modification to the cell architecture (the addition of a second read word line and second NFET stack) provides the additional capability of providing a NAND function.

Figure 5:
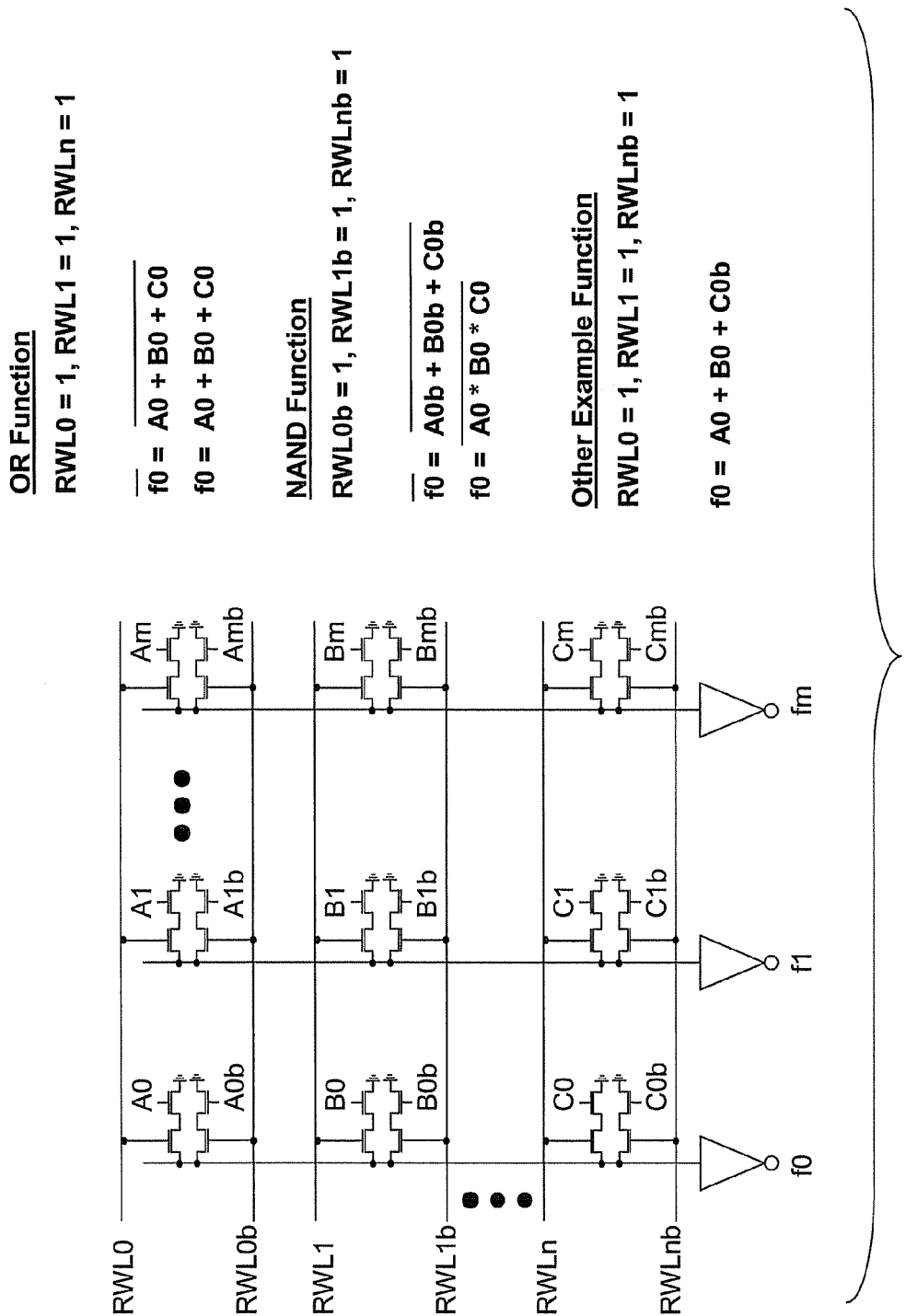
FIG. 5 is a schematic diagram illustrating the use of the array cells of FIG. 4 to implement a bit wise, logical operation of bits in a given column by simultaneous activation of multiple read word lines, including OR, NAND and other functions.

More specifically, FIG. 5 is a schematic diagram illustrating the use of the array cells of FIG. 4 to implement a bit wise, logical operation of bits in a given column by simultaneous activation of multiple read word lines, including OR, NAND and other functions. By using both the true and complement nodes of an SRAM cell, there is the added capability of generating bit wise NAND functionality for columns of bits due to the negation principle of DeMorgan's theorem, which recognizes that: not (A and B)=(not (A) or not (B)). For each row of the array, then, there are two address control signals— one for the first read word line (e.g., RWL0) and another for the second read word line (e.g., RWL0b).

As described above, a logical OR operation may be performed for the true value of the column bits of each selected row by activating the first of the pair of read word lines RWL0, RWL1, ..., RWLn, etc. In addition, by activating the second of the pair of read word lines RWL0b, RWL1b, ..., RWLnb, etc., associated with the complement values of the column bits (e.g., A0b, B0b, C0B, etc.), a logical OR operation of the complement data values also results. In terms of the schematic shown in FIG. 5:

$$\overline{f0} = \overline{A0b + B0b + C0b};$$

which is the logical equivalent of the expression:

$f0 = \overline{A0} * \overline{B0} * \overline{C0}$ (i.e., a NAND operation of the true data values). Still additional logical operations can be performed on selected bits within a given column by activation either the first or second of the read word lines in each row. Therefore, because a second set of read word lines is available to perform logical OR operations on the complement data values, a memory array configured with cells such as shown in FIG. 4 also has computational capability without the use of a discrete ALU integrated therein.

It should be noted at this point that a memory array, such as schematically depicted in FIG. 5, can still be operated in a normal "read" mode. That is, the (first) read word line of a single selected row can be selected to read the true state of the cell data. Moreover, with the additional read bit line connection to the complement side of the cell, a read operation can be used to read the complement state of the cell by activating the other (second) read word line of the single selected row. One operation that would not be utilized, however, is the simultaneous activation of both read word lines in a given row, since this would always result in the discharge of the read bit line, regardless of the cell values. In addition, it will also be noted that to provide the correct logical outputs of the memory array (with respect to precharged read bit lines), the voltage on each bit line is inverted to produce the corresponding outputs f0, f1, ... fm.

Figure 6:
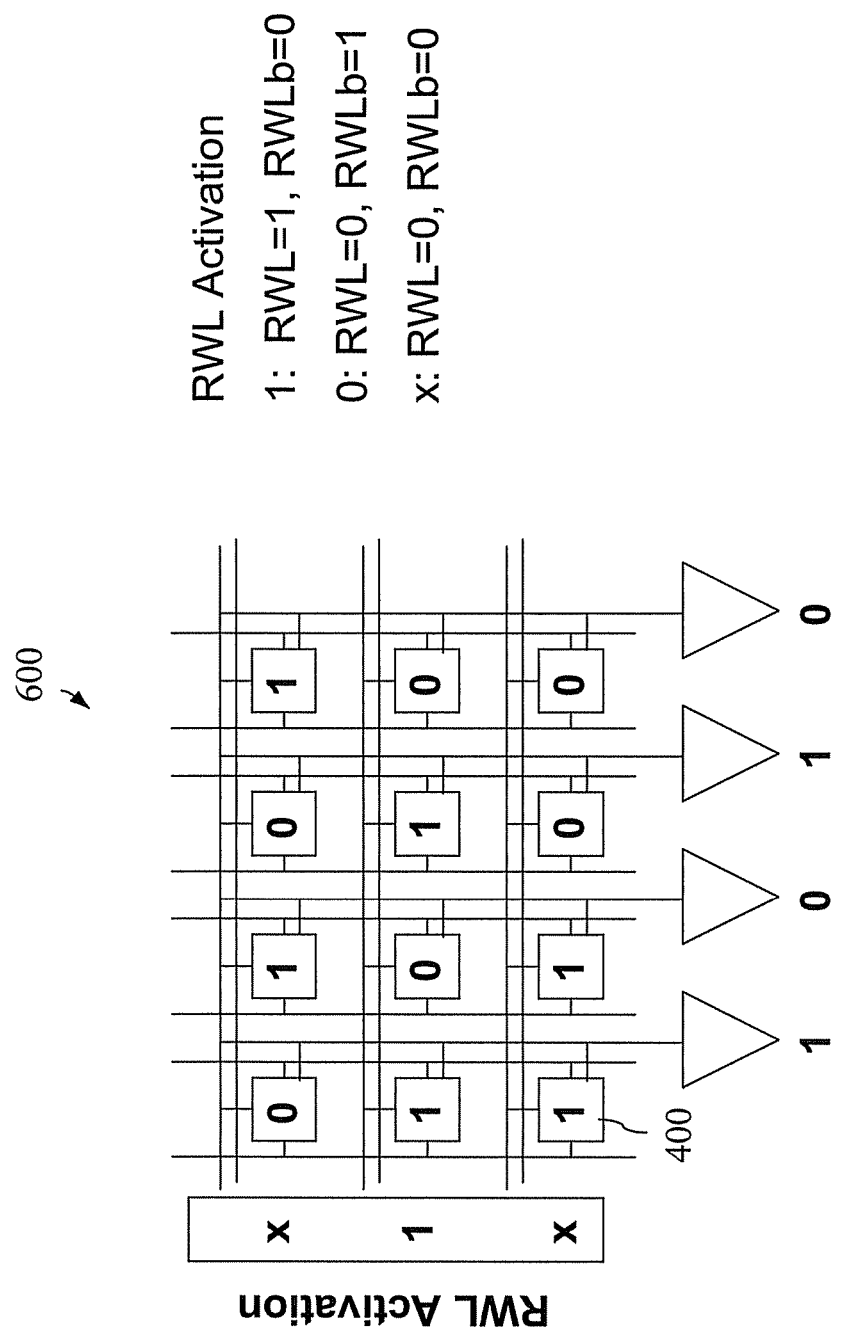
FIG. 6 is a schematic diagram illustrating a simple read operation of a computational array, in accordance with a further embodiment of the invention.

Referring now to FIG. 6, a simple read operation of a computational array 600 as described above is illustrated. As shown in the legend, state "1" represents the activation of the first read word line of a row pair and deactivation of the second (or "b") read word line of the row pair. State "0" represents the activation of the second read word line of a row pair and deactivation of the first read word line of the row pair. Finally, state "x" represents deactivation of both pairs of read word lines for a given row. Again, there is no defined state in which both pairs both pairs of read word lines for a given row are activated.

According to the presented address states in FIG. 6, the operation of the array 600 is a simple read of the data (word) stored in the cells 400 of the second row (i.e., '1010'), since only the first read word line in the second row is activated. That is, the second read word line in the second row, and all other word line pairs are deactivated. The resulting output is therefore the data stored in the second row, '1010'.

Figure 7:
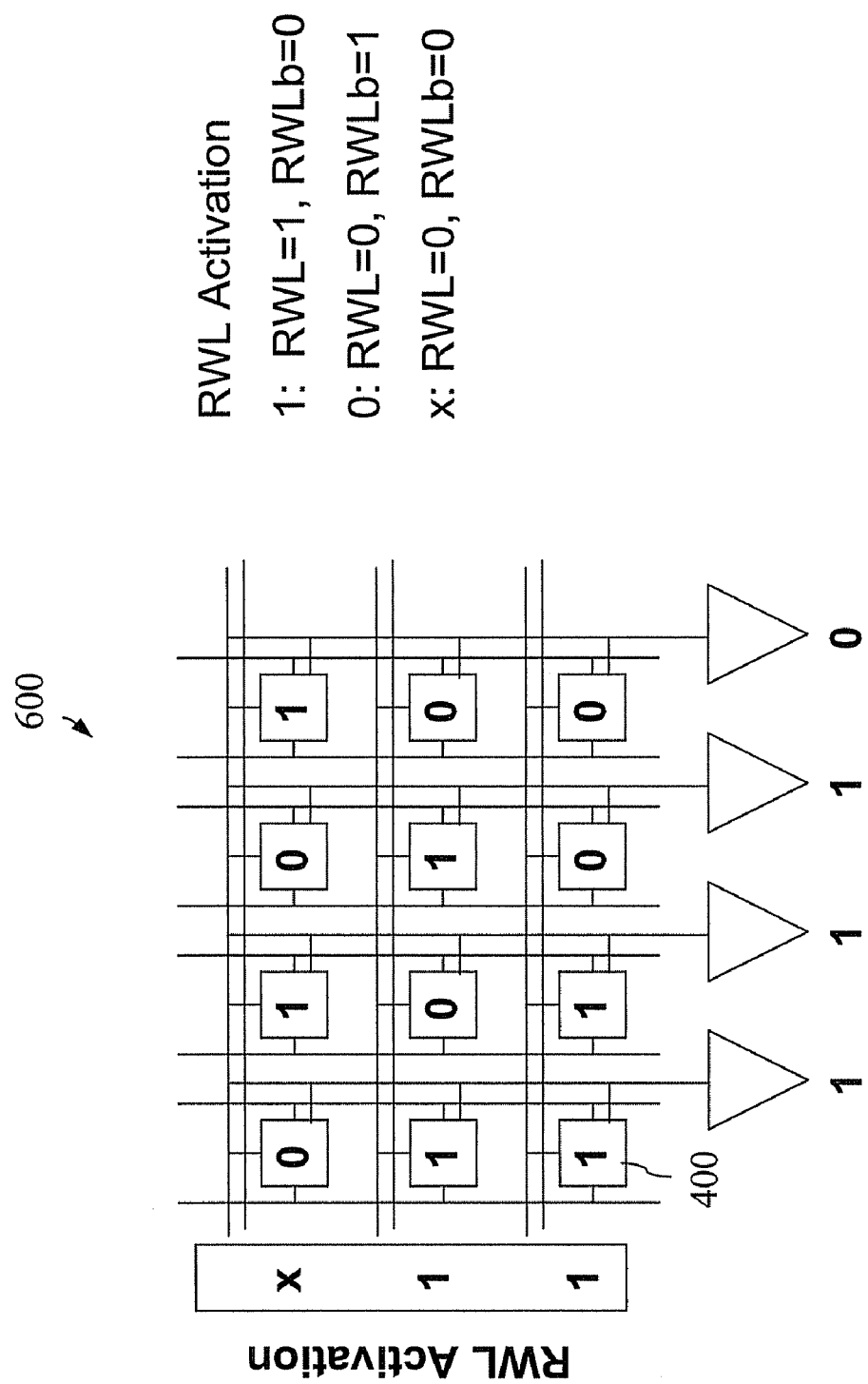
FIG. 7 is a schematic diagram illustrating an OR operation of multiple words, using the array data as shown in FIG. 6.

In contrast, FIG. 7 illustrates an OR operation of multiple words, using the same array data as shown in FIG. 6. More specifically, the presented address states reflect a bit wise OR operation for the true data in rows 2 and 3 of the array. That is, the "true" (first) read word lines of rows 2 and 3 are activated, with the read word line pair of row 1 remaining deactivated. The result is a bit wise ORing of the words in rows 2 and 3.

Figure 8:
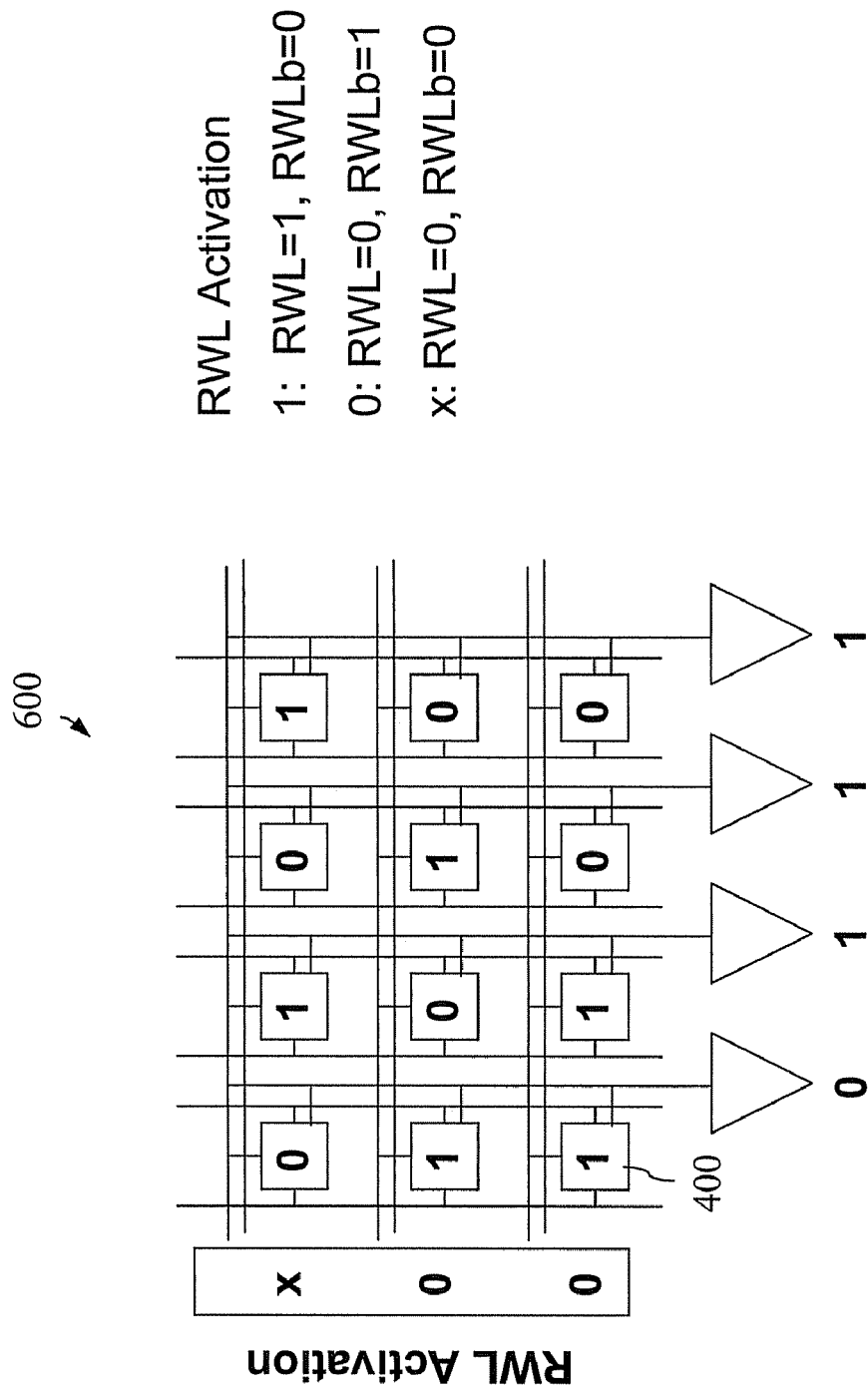
FIG. 8 is a schematic diagram illustrating a NAND operation of multiple words, using the array data as shown in FIG. 6.
Figure 9:
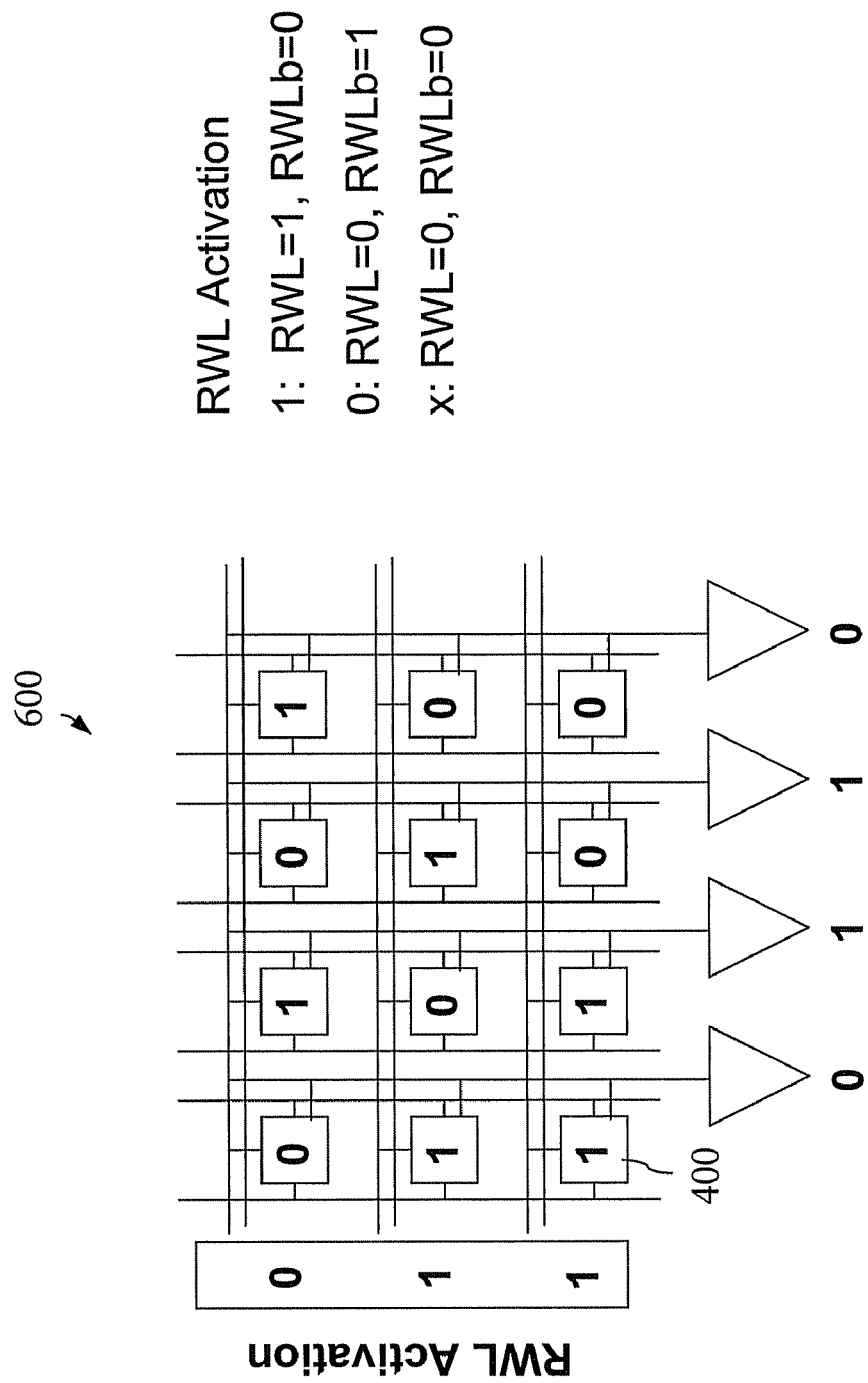
FIG. 9 is a schematic diagram illustrating still another combinational logic operation of multiple words, using the array data as shown in FIG. 6.

In still another example, FIG. 8 illustrates a NAND operation of the words in rows 2 and 3. Row 1 is still deactivated (state "x"), but activation state "0" is now applied to rows 2 and 3, meaning that the complement states of the cell data in rows 2 and 3 are logically ORed. As indicated above, this is logically equivalent to a NAND operation of the true states of the cell data in rows 2 and 3. Lastly, FIG. 9 illustrates a combinational logic function of multiple words, in which the complement bits of the word in row 1 are logically ORed with the true bits in words in both row 2 and row 3.

Figure 10:
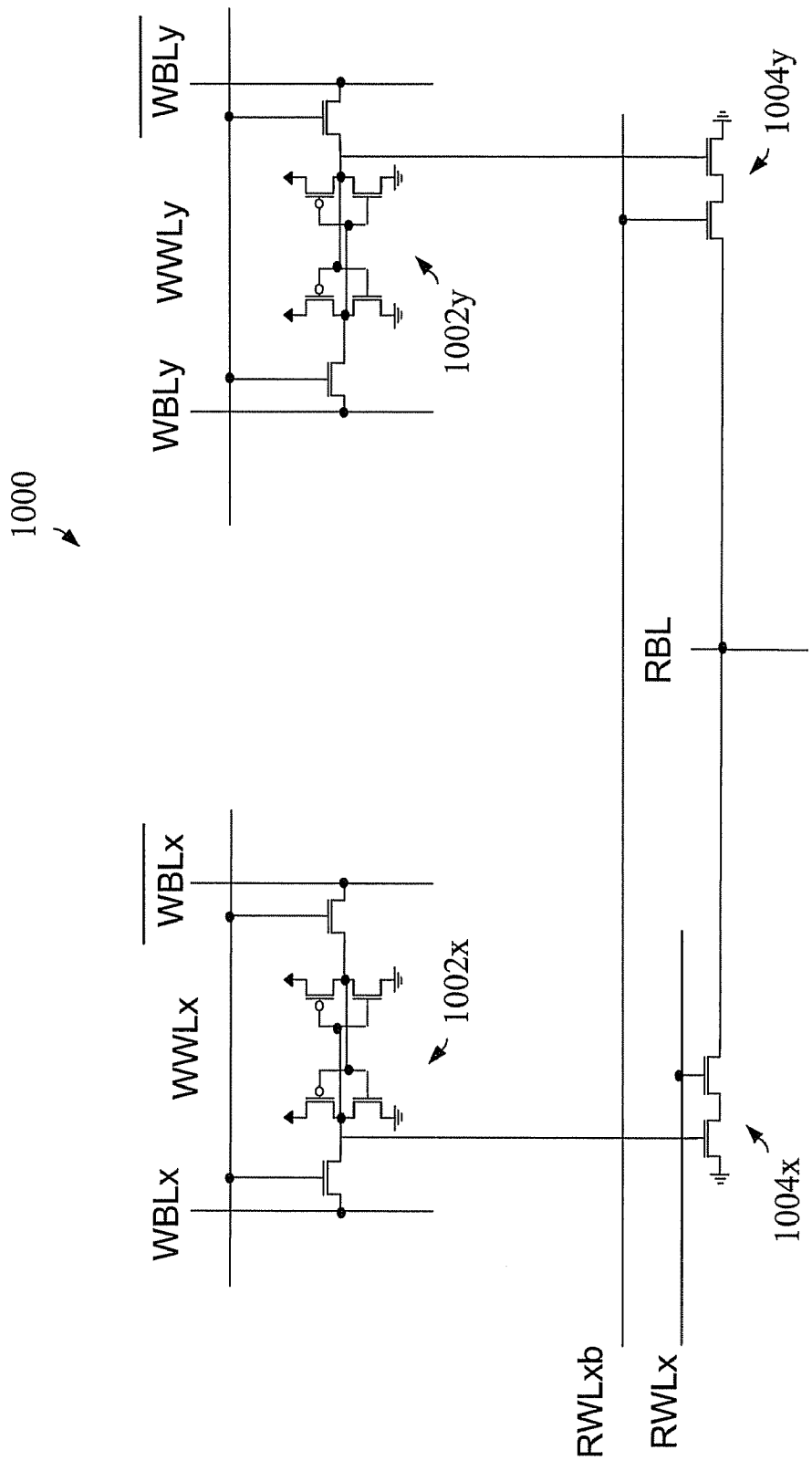
FIG. 10 is a schematic diagram of a 16-transistor (16T) ternary memory cell that may be used to provide computational capability, in accordance with another embodiment of the invention.

To this point, the computational memory embodiments have been discussed in terms of a binary storage capability (i.e., the cell stores either a "0" or a "1" therein). However, the added computational capability for memory arrays is also applicable to ternary storage cells, which also have the capability of storing a "don't care" state therein. Accordingly, FIG. 10 is a schematic diagram of a 16-transistor (16T) ternary memory cell 1000 that may be used to provide computational capability, in accordance with another embodiment of the invention. As is the case with the memory cell 400 of FIG. 4, cell 1000 also uses a pair of read word lines RWLx, RWLxb for each row of the array. However, in the embodiment of FIG. 10, the cell 1000 includes a pair of 6T SRAM storage devices, 1002x, 1002y. The added SRAM device allows for a don't care state within the cell 1000.

Figure 11:
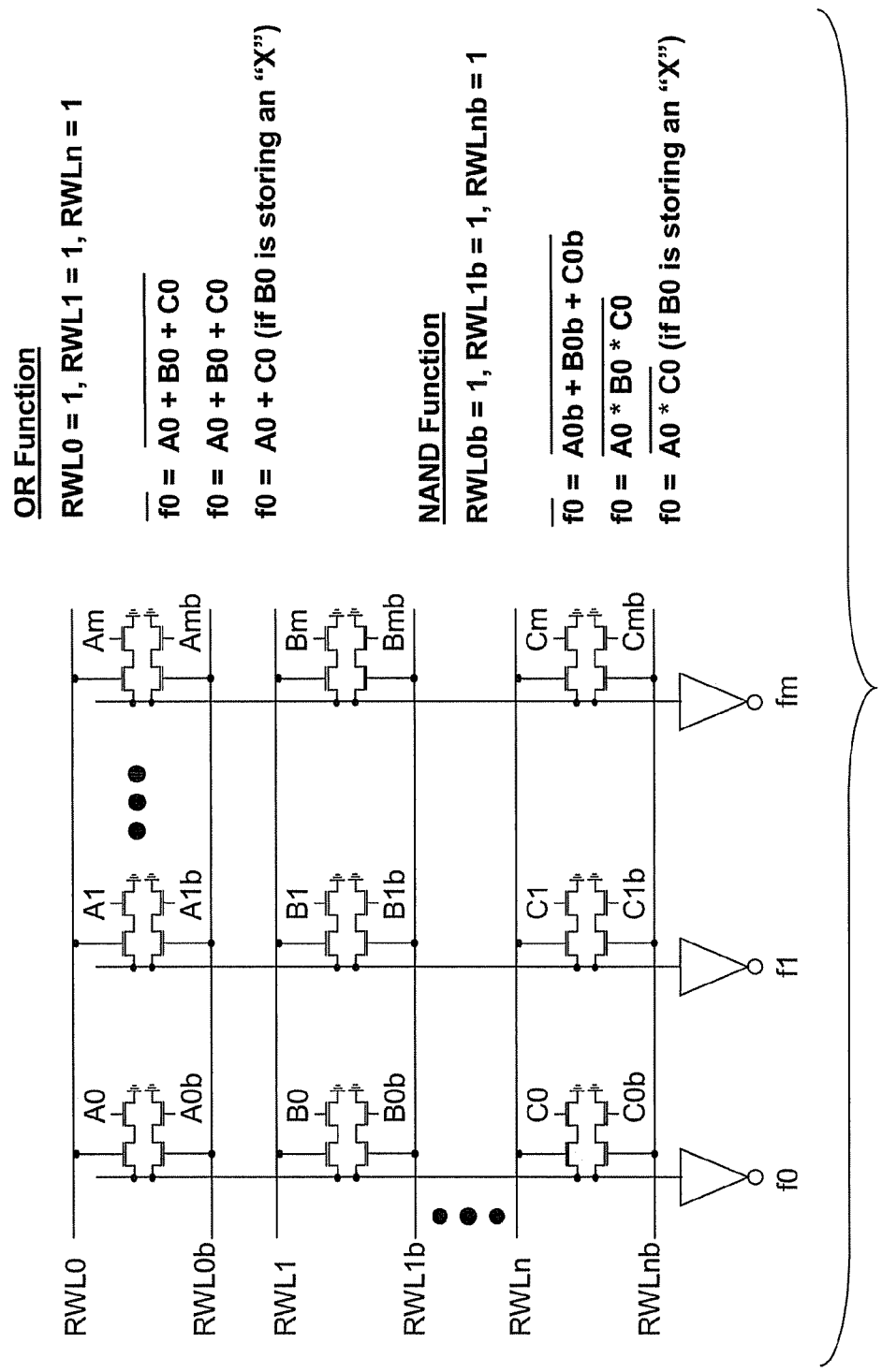
FIG. 11 is a schematic diagram illustrating the use of the ternary array cells of FIG. 10 to implement a bit wise, logical operation of bits in a given column by simultaneous activation of multiple read word lines, including OR, NAND and other functions.

Also in contrast with the embodiment of FIG. 4, the first NFET stack 1004x associated with first read word line RWLx of the read word line pair is coupled to the true node of the first SRAM device 1002x. The second NFET stack 1004y associated with second read word line RWLxb of the read word line pair is coupled to the true node of second SRAM device 1002y. FIG. 11 is a schematic diagram illustrating the use of the ternary array cells of FIG. 10 to implement a bit wise, logical operation of bits in a given column by simultaneous activation of multiple read word lines, including OR, NAND and other functions.

As is the case with the binary SRAM cell, the array depicted in FIG. 11 is capable of bit wise OR, NAND and other logical operations. For example, in the case of an OR function performed on the true column data, the first of the pair of read word lines RWL0, RWL1, ..., RWLn, etc., are activated. In terms of the schematic shown in FIG. 11:

$$\overline{f0} = \overline{A0 + B0 + C0}; \text{ and}$$

$$f0 = A0 + B0 + C0.$$

However, for a ternary cell array, where B0 (for example) stores an "X" or "don't care" state, the above expression then reduces to:

f0=A0+C0. Similarly, in the case of a NAND operation on column data having a "don't care" bit stored in one of the words, the operation:

$$\overline{f0} = \overline{A0b + B0b + C0b};$$

which, as indicated above, is equivalent to:

$$f0 = \overline{A0} * \overline{B0} * \overline{C0};$$

and then further reduces to:
$f0 = \overline{A0} * \overline{C0}$ when B0 stores a "don't care" state.

Figure 12:
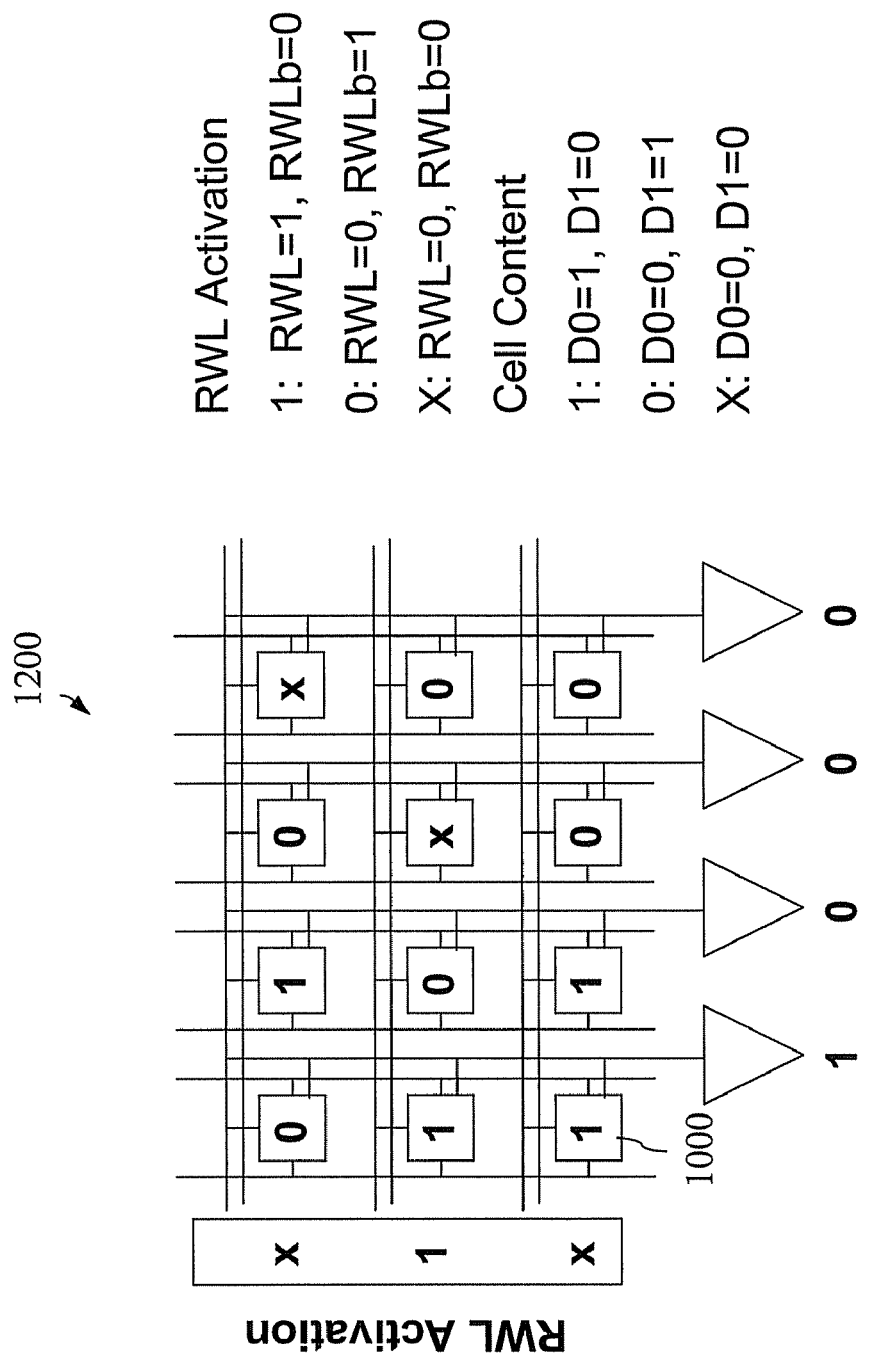
FIG. 12 is a schematic diagram illustrating a simple read operation of a computational ternary array, in accordance with a further embodiment of the invention.

Referring now to FIG. 12, a simple read operation of a computational ternary array 1200 as described above is illustrated. As shown in the legend, state "1" represents the activation of the first read word line of a row pair and deactivation of the second (or "b") read word line of the row pair. State "0" represents the activation of the second read word line of a row pair and deactivation of the first read word line of the row pair. Finally, state "x" represents deactivation of both pairs of read word lines for a given row. Again, there is no defined state in which both pairs both pairs of read word lines for a given row are activated.

According to the presented address states in FIG. 12, the operation of the array 1200 is a simple read of the data (word) stored in the cells 1000 of the second row (i.e., '10X0'), since only the first read word line in the second row is activated. That is, the second read word line in the second row, and all other word line pairs are deactivated. The resulting output is therefore the data stored in the second row, '1000', noting that the third bit of the row stores a "don't care" state. As shown in the legend in FIG. 12, the "don't care" state corresponds to a logical "0" stored in both SRAM devices of the cell.

Figure 13:
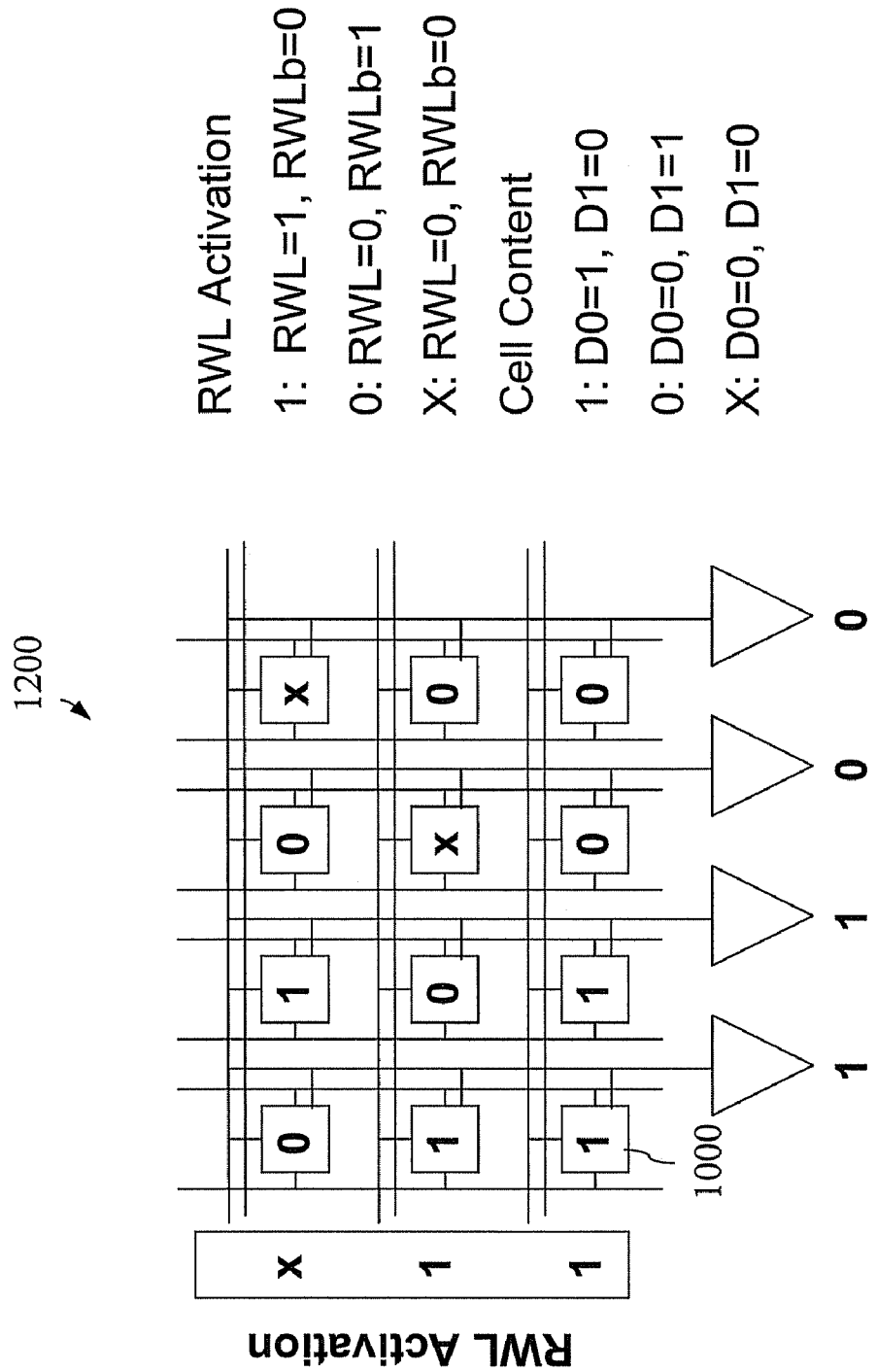
FIG. 13 is a schematic diagram illustrating an OR operation of multiple words, using the array data as shown in FIG. 12.

FIG. 13 illustrates an OR operation of multiple words, using the same ternary array data as shown in FIG. 12. More specifically, the presented address states reflect a bit wise OR operation for the true data in rows 2 and 3 of the array. That is, the "true" (first) read word lines of rows 2 and 3 are activated, with the read word line pair of row 1 remaining deactivated. The result is a bit wise ORing of the words in rows 2 and 3.

Figure 14:
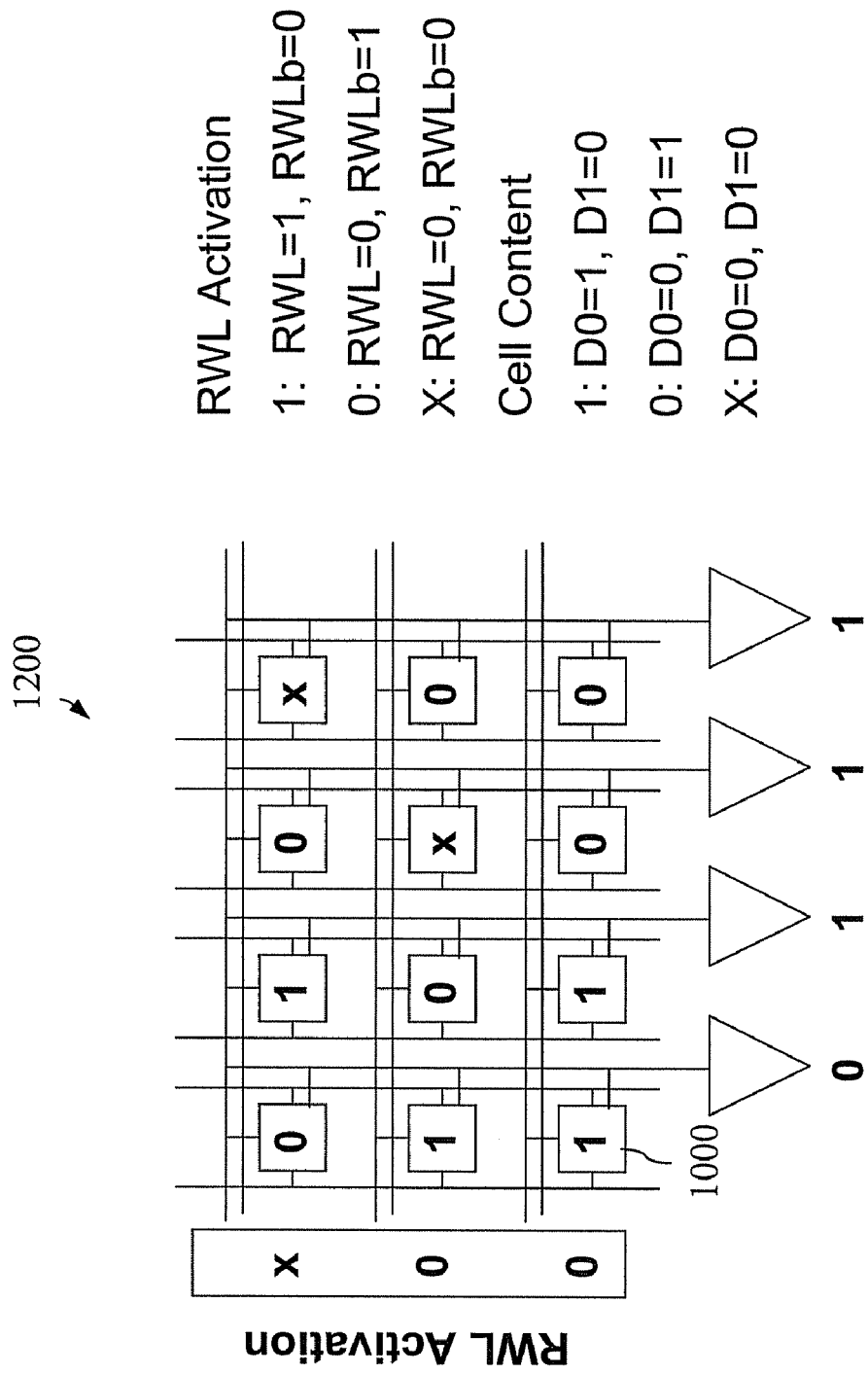
FIG. 14 is a schematic diagram illustrating a NAND operation of multiple words, using the array data as shown in FIG. 12.
Figure 15:
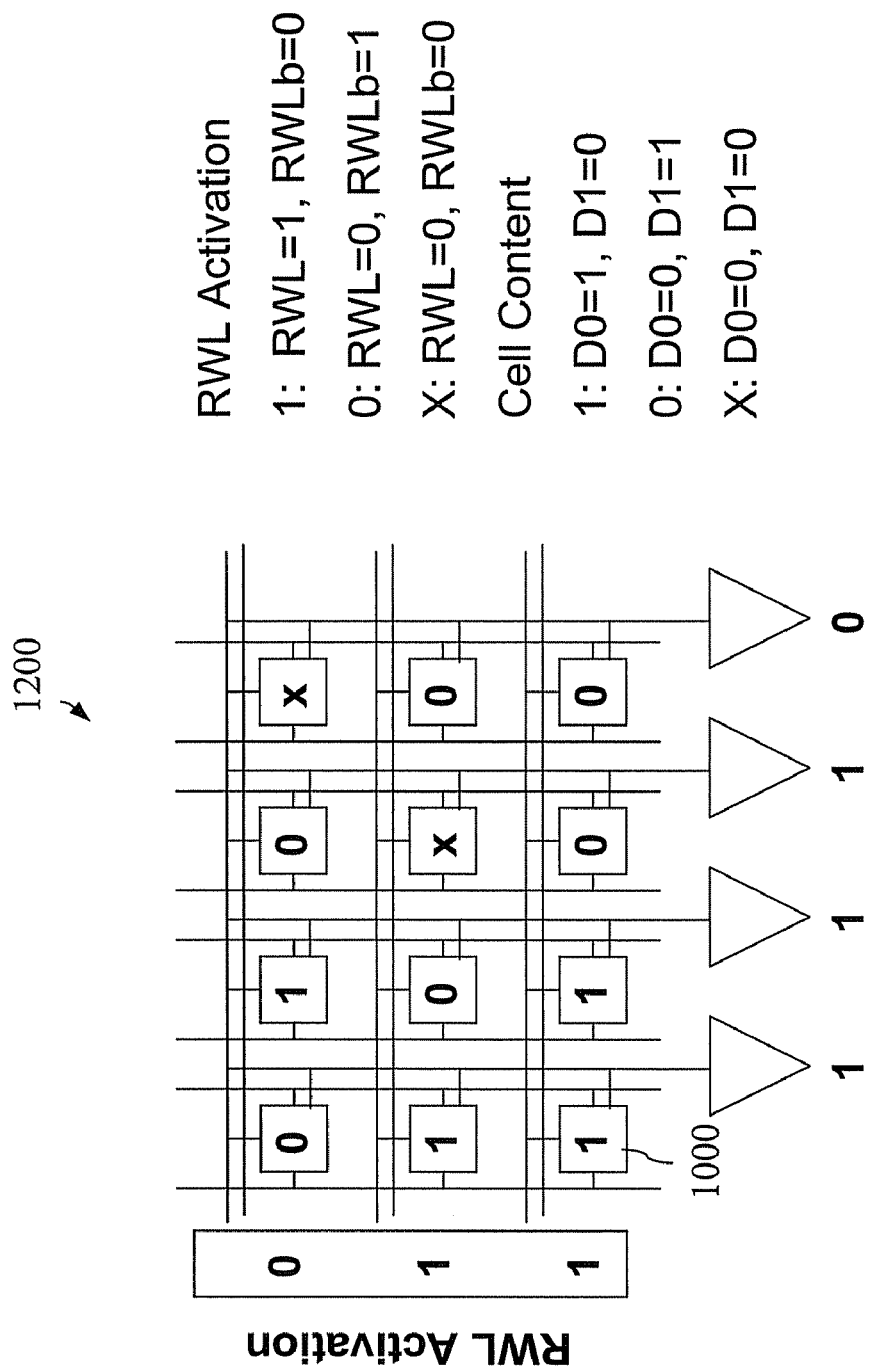
FIG. 15 is a schematic diagram illustrating still another combinational logic operation of multiple words, using the array data as shown in FIG. 12.

In still another example, FIG. 14 illustrates a NAND operation of the words in rows 2 and 3. Row 1 is still deactivated (state "x"), but activation state "0" is now applied to rows 2 and 3, meaning that the complement states of the cell data in rows 2 and 3 are logically ORed. As indicated above, this is logically equivalent to a NAND operation of the true states of the cell data in rows 2 and 3. FIG. 15 illustrates a combinational logic function of multiple words, in which the complement bits of the word in row 1 are logically ORed with the true bits in words in both row 2 and row 3.

Figure 16:
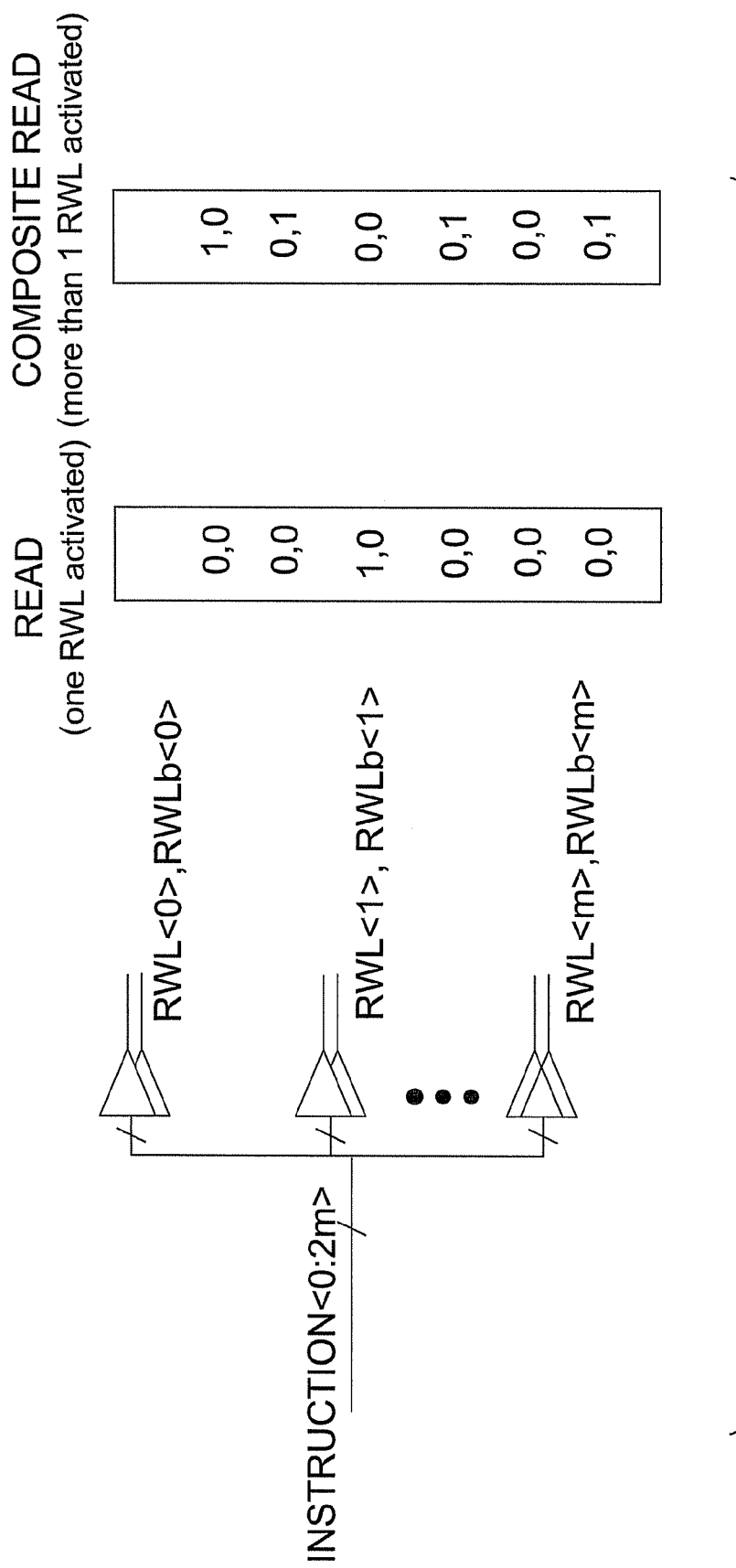
FIG. 16 is a schematic diagram illustrating one possible representation of a control mechanism for read word line activation for the computational memory embodiments.

FIG. 16 is a schematic diagram illustrating one possible representation of a control mechanism for read word line activation for the computational memory embodiments discussed above. For a computational array having m rows, then a 2m-bit wide instruction may be provided to the memory to execute any read or bit wise combinational logic operation. In the case of an ordinary read operation, only one read word line (RWL) is activated during a cycle. However, when the array is to be used in a computational capacity, more than one read word line (RWL, RWLb) may be activated. As an alternative to a 2m-bit wide instruction, address decode circuitry could also be implemented in conjunction with the computational array. For example, for a two-word logical operation, an address decoder may be associated with each of the two words to be the operands of the operation. Then, an operation control block can select between an AND or an OR operation on the two words.

Figure 17:
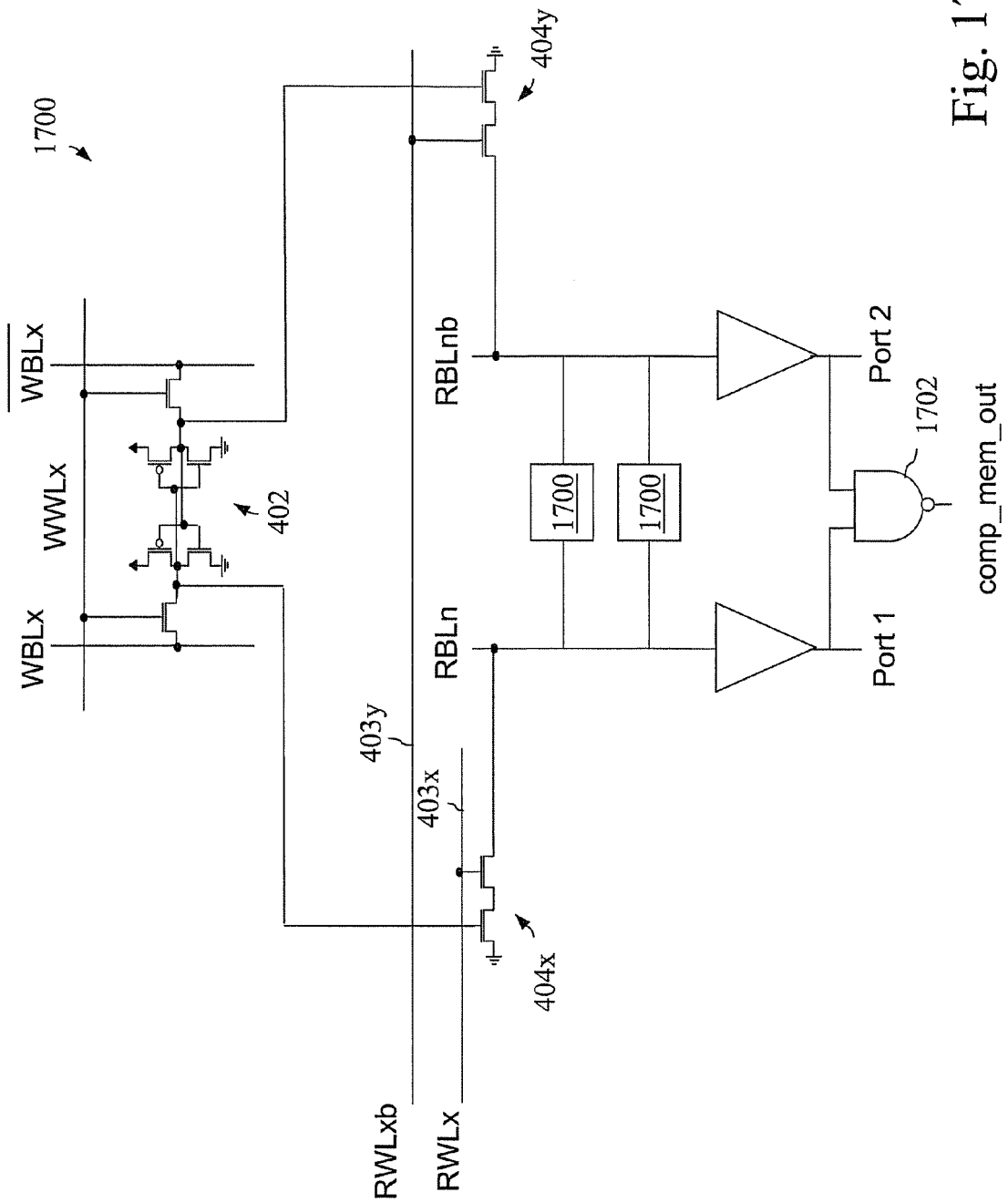
FIG. 17 is a schematic diagram of an alternative embodiment of the 10T computational memory cell of FIG. 4, adapted for a 2-port read structure.

FIG. 17 is a schematic diagram of an alternative embodiment of a 10T computational memory cell 1700, adapted for a 2-port read structure. In a 2-port read memory structure (Port 1, Port 2), a second read bit line (RBLnb) is provided for specifically reading the data in the complementary node of the SRAM storage device 402, through the use of NFET stack 404y. During a normal read operation of a cell for a single selected row, the true and/or complementary data for the cells in the row are indicated on the respective read bit lines RBLn and RBLnb. However, in the event a bit wise computational operation on multiple word data is desired, suitable circuitry, such as NAND gate 1702 may be provided to essentially tie the signals on the pair of read bit lines RBLn and RBLnb together, so that a single output line (comp_mem_out) reflects the desired logical operation on the word data.

As will be appreciated, other circuit equivalents can also be used to "tie" the 2-port read bit lines together during a computational mode of operation. For example, a control signal reflective of a read/computational mode of operation could be used to selectively short/unshort the read bit lines together.

Figure 18:
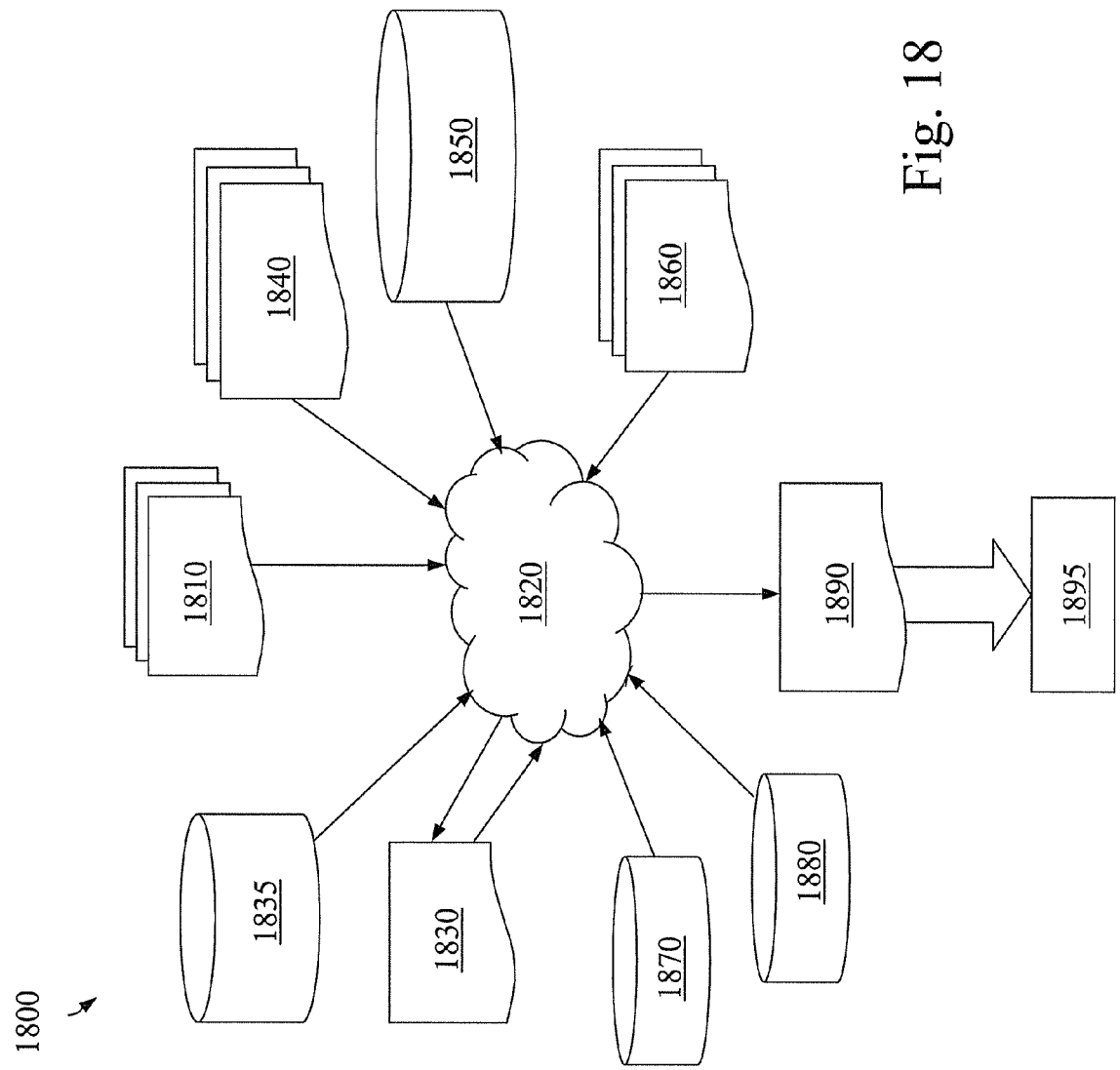
FIG. 18 is a flow diagram of an exemplary design process used in semiconductor design, manufacturing, and/or test.

FIG. 18 is a block diagram illustrating an example of a design flow 1800. Design flow 1800 may vary depending on the type of IC being designed. For example, a design flow 1800 for building an application specific IC (ASIC) will differ from a design flow 1800 for designing a standard component. Design structure 1810 is preferably an input to a design process 1820 and may come from an IP provider, a core developer, or other design company or may be generated by the operator of the design flow, or from other sources. Design structure 1810 comprises circuit embodiments 400, 1000, 1700 in the form of schematics or HDL, a hardware-description language, (e.g., Verilog, VHDL, C, etc.). Design structure 1810 may be contained on one or more machine readable medium(s). For example, design structure 1810 may be a text file or a graphical representation of circuit embodiments 400, 1000, 1700 illustrated in FIGS. 4, 10 and 17. Design process 1820 synthesizes (or translates) circuit embodiments 400, 1000, 1700 into a netlist 1830, where netlist 1830 is, for example, a list of wires, transistors, logic gates, control circuits, I/O, models, etc., and describes the connections to other elements and circuits in an integrated circuit design and recorded on at least one of a machine readable medium. This may be an iterative process in which netlist 1830 is resynthesized one or more times depending on design specifications and parameters for the circuit.

Design process 1820 includes using a variety of inputs; for example, inputs from library elements 1835 which may house a set of commonly used elements, circuits, and devices, including models, layouts, and symbolic representations, for a given manufacturing technology (e.g., different technology nodes, 32 nm, 45 nm, 90 nm, etc.), design specifications 1840, characterization data 1850, verification data 1860, design rules 1870, and test data files 1880, which may include test patterns and other testing information. Design process 1820 further includes, for example, standard circuit design processes such as timing analysis, verification tools, design rule checkers, place and route tools, etc. One of ordinary skill in the art of integrated circuit design can appreciate the extent of possible electronic design automation tools and applications used in design process 1820 without deviating from the scope and spirit of the invention. The design structure of the invention embodiments is not limited to any specific design flow.

Design process 1820 preferably translates embodiments of the invention as shown in FIGS. 4, 10 and 17, along with any additional integrated circuit design or data (if applicable), into a second design structure 1890. Second design structure 1890 resides on a storage medium in a data format used for the exchange of layout data of integrated circuits (e.g. information stored in a GDSII (GDS2), GL1, OASIS, or any other suitable format for storing such design structures). Second design structure 1890 may comprise information such as, for example, test data files, design content files, manufacturing data, layout parameters, wires, levels of metal, vias, shapes, data for routing through the manufacturing line, and any other data required by a semiconductor manufacturer to produce embodiments of the invention as shown in FIGS. 4, 10 and 17. Second design structure 1890 may then proceed to a stage 1895 where, for example, second design structure 1890: proceeds to tape-out, is released to manufacturing, is released to a mask house, is sent to another design house, is sent back to the customer, etc.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A design structure embodied in a non-transitory, machine readable medium used in a design process, the design structure comprising:
   a computational memory device including an array of memory cells arranged in rows and columns; and
   a pair of read word lines associated with each row of the array;
   wherein the array is configured to implement, for a first cycle, a read operation of data contained in a single selected row, and, for a second cycle, one of a plurality of different bit wise logical operations on data contained in multiple selected rows;
   wherein the design structure comprises a netlist describing the computational memory device.

2. The design structure of claim 1, wherein the plurality of different bit wise logical operations implementable by the array include OR operations, NAND operations, and combinations thereof.

3. The design structure of claim 2, wherein each of the memory cells further comprise:
   an SRAM storage device configured to store a data bit therein;
   a first NFET stack associated with a true data node of the SRAM storage device and a first of the pair of read word lines of the corresponding row of the cell; and
   a second NFET stack associated with a complementary data node of the SRAM storage device and a second of the pair of read word lines of the corresponding row of the cell;
   wherein both the first and second NFET stacks are configured to discharge a precharged read bit line associated with the corresponding column of the array, depending upon the state of the associated read word line and the associated data node of the SRAM storage device.

4. The design structure of claim 3, wherein output bits of the memory array comprise inverted values of the voltages of the read bit lines.

5. The design structure of claim 4, wherein for the read operation of data contained in a single selected row, the first read word line of the selected row is activated, the second read word line of the selected row is deactivated, and the first and second read word lines of all other non-selected rows are deactivated.

6. The design structure of claim 4, wherein for the OR operation of data contained in multiple selected rows, the first read word line of each of the multiple selected rows is activated, the second read word line of each of the multiple selected rows is deactivated, and the first and second read word lines of all other non-selected rows are deactivated.

7. The design structure of claim 4, wherein for the NAND operation of data contained in multiple selected rows, the second read word line of each of the multiple selected rows is activated, the first read word line of each of the multiple selected rows is deactivated, and the first and second read word lines of all other non-selected rows are deactivated.

8. The design structure of claim 4, wherein for a combination of OR and NAND operations of data contained in multiple selected rows, either the first read word line or the second read word line of each of the multiple selected rows is activated, and the first and second read word lines of all other non-selected rows are deactivated.

9. The design structure of claim 2, wherein each of the memory cells further comprise:
   a first SRAM storage device configured to store a first data bit therein;
   a second SRAM storage device configured to store a second data bit therein, the first and second SRAM storage device thereby forming a ternary cell;
   a first NFET stack associated with a true data node of the first SRAM storage device and a first of the pair of read word lines of the corresponding row of the cell; and
   a second NFET stack associated with a true data node of the second SRAM storage device and a second of the pair of read word lines of the corresponding row of the cell;
   wherein both the first and second NFET stacks are configured to discharge a precharged read bit line associated with the corresponding column of the array, depending upon the state of the associated read word line and the true data node of the associated SRAM storage device.

10. The design structure of claim 9, wherein output bits of the memory array comprise inverted values of the voltages of the read bit lines.

11. The design structure of claim 10, wherein for the read operation of data contained in a single selected row, the first read word line of the selected row is activated, the second read word line of the selected row is deactivated, and the first and second read word lines of all other non-selected rows are deactivated.

12. The design structure of claim 10, wherein for the OR operation of data contained in multiple selected rows, the first read word line of each of the multiple selected rows is activated, the second read word line of each of the multiple selected rows is deactivated, and the first and second read word lines of all other non-selected rows are deactivated.

13. The design structure of claim 10, wherein for the NAND operation of data contained in multiple selected rows, the second read word line of each of the multiple selected rows is activated, the first read word line of each of the multiple selected rows is deactivated, and the first and second read word lines of all other non-selected rows are deactivated.

14. The design structure of claim 10, wherein for a combination of OR and NAND operations of data contained in multiple selected rows, either the first read word line or the second read word line of each of the multiple selected rows is activated, and the first and second read word lines of all other non-selected rows are deactivated.

15. The design structure of claim 2, wherein each of the memory cells further comprise:
   an SRAM storage device configured to store a data bit therein;
   a first NFET stack associated with a true data node of the SRAM storage device and a first of the pair of read word lines of the corresponding row of the cell; and
   a second NFET stack associated with a complementary data node of the SRAM storage device and a second of the pair of read word lines of the corresponding row of the cell;
   the first NFET stack configured to discharge a first precharged read bit line associated with the corresponding column of the array, and the second NFET stack configured to discharge a second precharged read bit line associated with the corresponding column of the array so as to define a 2-port read device; and
   circuitry configured to tie the first and second read bit lines together during the implementation of the bit wise logical operations on data contained in multiple selected rows.

16. The design structure of claim 1, wherein the design structure resides on storage medium as a data format used for the exchange of layout data of integrated circuits.

17. The design structure of claim 1, wherein the design structure includes at least one of test data files, characterization data, verification data, programming data, or design specifications.

* * * * *